United States Patent
Yamamoto et al.

(10) Patent No.: US 6,818,436 B2
(45) Date of Patent: Nov. 16, 2004

(54) MICRO ARRAY CHIP

(75) Inventors: Rintaro Yamamoto, Kyoto (JP); Shin Nakamura, Moriyama (JP); Tsutomu Nishine, Moriyama (JP); Toshihiko Yoshida, Uji (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 10/235,971

(22) Filed: Sep. 5, 2002

(65) Prior Publication Data

US 2003/0047761 A1 Mar. 13, 2003

(30) Foreign Application Priority Data

Sep. 7, 2001 (JP) .......................... 2001-271295

(51) Int. Cl.[7] ............................... C12M 3/00

(52) U.S. Cl. ................................ 435/288.4; 257/618

(58) Field of Search .................. 257/618, 626; 435/288.4

(56) References Cited

U.S. PATENT DOCUMENTS

| | | | | |
|---|---|---|---|---|
| 4,570,173 A | * | 2/1986 | Anthony et al. | 257/618 |
| 4,975,390 A | * | 12/1990 | Fujii et al. | 438/53 |
| 5,506,141 A | * | 4/1996 | Weinreb et al. | 435/309.1 |
| 5,792,653 A | * | 8/1998 | Weibezahn et al. | 435/288.5 |
| 6,060,773 A | * | 5/2000 | Ban et al. | 257/679 |
| 6,188,819 B1 | * | 2/2001 | Kosaka et al. | 385/39 |
| 6,340,589 B1 | * | 1/2002 | Turner et al. | 435/287.2 |

* cited by examiner

*Primary Examiner*—Allan R. Wilson
(74) *Attorney, Agent, or Firm*—Rankin, Hill, Porter & Clark LLP

(57) ABSTRACT

A micro array chip is formed by high-speed in jection molding. A chip body has a thickness of 1 mm and each well has a capacity of 1.2 μL with the bottom having a wall thickness of 250 μm. An opening of each well is surrounded by an annular protrusion part, which is raised from a surface of the chip body by a height of 200 μm. The openings of wells may be closed with a sheet of sealant made of aluminum or a resin. An overall shape of the micro array chip is rectangular and is a flat plate with a level bottom surface. Therefore, the micro array chip can be used with a heat block in flat plate form, which is independent of chip specifications such as a number of wells and their shape.

20 Claims, 2 Drawing Sheets

MICRO ARRAY CHIP

BACKGROUND OF THE INVENTION

1. Field of the Invention

The invention relates to a micro array chip having wells using for reaction vessels where in vivo samples are subjected to enzyme treatment, formation of derivatives, PCR (polymerase chain reaction), Sanger's reaction, etc, and more relates to the micro array chip for reaction vessels of small capacity.

2. Description of the Related Art

When Polymerase chain reaction (hereinafter, referred to PCR) and other reactions are performed with small amounts of sample, microtiter plates having 96 or 384 wells are conventionally used as reaction vessels.

In order to perform reaction with microtiter plates, the required sample quantity is from 20 to 40 $\mu$L for a 96-well plate and from 5 to 10 $\mu$L for a 384-well plate.

With recent improvements in the performance of DNA sequencer and other equipment, it has become possible to analyze small amounts of sample. As a result, pretreatments such as PCR and Sanger's reaction can now be performed on small sample quantities.

A cost of reagents has been a great burden when reactions are performed on the quantity using a conventional microtiter plate. Therefore, it is preferred to process samples in smaller quantities.

The microtiter plate is an array of interconnected single wells and its bottom follows a shape of wells.

In the case of reactions such as PCR that require heat treatment, temperature control is performed with a heat block being in contact with a bottom of the microtiter plate.

Since the bottom of the microtiter plate is uneven, and further a capacity of each well is fairly large, the heat block is fabricated in order to conform to the shape of the bottom of the microtiter plate. Therefore, when using microtiter plates of different well numbers it is inconvenient to change the heat blocks in accordance with the microtiter plates.

SUMMARY OF THE INVENTION

It is an object of the invention to provide a micro array chip that can be changed for another chip of a different well number or shape without changing a heat block. Therefore, the micro array chip can be handled conveniently and at lower cost.

In a first aspect of the invention, a micro array chip comprising:

a chip body having a plurality of openings on a top surface of the chip body and a bottom surface with a flat shape; and a plurality of recesses formed in the openings, each of the recesses having with capacity of a few microliters or less, wherein a distance between a bottom of the recesses and the bottom surface is 300 micrometers or less.

In the second aspect of the invention, the chip body has a first member having a flat-plate shape with a plurality of through-holes, and a thin film has a thickness of 300 micrometers or less, and the recesses are formed by closing the through-holes with the thin film.

According to the first and second aspects of the invention, an invention can be attained by a micro array chip with a plurality of recesses that are open to a surface of a chip body in flat plate form and which have a capacity of less than a few microliters and a bottom with a wall thickness of 300 micrometers or less.

The recesses in the chip body have a very small capacity, so if they are used as reaction vessels, samples can be processed in smaller quantities. In addition, a plurality of reaction vessels can be stacked one on another.

Since the bottom of each recess has a wall thickness of 300 micrometers or less, the efficiency of heat conduction from a heat block to the bottom of the chip body is high. Accordingly, a temperature of a liquid in the recesses can be effectively controlled as long as the heat block contacts the bottom of each recess.

The microtiter plates require heat blocks that conform to the shapes of wells in different plates. In the present invention, it is not necessary to use a planar heat block of different types of micro array chip.

The recesses may be formed in the chip body. Alternatively, due to a small capacity of the recesses, through-holes may be formed in the chip body, and then the openings at the bottom may be closed with a thin film so that the recesses are formed. It has an advantage of facilitating chip production.

In the third aspect of the invention, some recesses are used as reaction vessels and others are used for lowering a heat capacity of the whole micro array chip.

According to the third aspect of the invention, through-holes or recesses may be formed in those areas of the chip body where no recesses are formed to provide reaction spaces. This contributes to lowering a heat capacity of the micro array chip taken as a whole and to enhancing an efficiency of temperature control in each reaction space.

In the forth aspect of the invention, inner surface of the recesses are treated against adherence of in vivo samples.

According to the forth aspect of the invention, since very small amounts of samples are processed, inner surfaces of the recesses are preferably treated against adherence of in vivo samples. This contributes to enhancing the reaction efficiency.

In the fifth aspect of the present invention, a sealing member covers the openings to form closed space in each of the recesses.

According to the fifth aspect of the invention, in the case of performing reaction using a very small amount of sample in reaction vessels, the recesses in the micro array chip are preferably sealed. Accordingly, the reagent concentrations will not vary due to evaporation and the reaction will not stop on account of insufficient mixing. To this end, the micro array chip preferably has a sealing member fitted on the open tops of the recesses to provide a closed space in each of them.

After reaction reagents are injected into the recesses in the chip, the sealing member is applied to the open top of the chip so that the reaction reagents are confined in each of the recesses.

In the six aspect of the invention, the chip body has a protrusion portion around each of the openings, the protrusion portion comes into contact with the sealing member to securely seal the recesses.

Raising the perimeter of the open top of each recess from the surface of the chip body is advantageous for the purpose of ensuring a higher level of airtightness in the openings after they are closed with the sealing member.

It is difficult to heat a liquid in the wells through heat conduction from lateral sides of the chip, so it is preferred to control a temperatures of both the upper and lower surfaces of the chip by the Pettier effect and thereby allow temperature control on the upper surface of the chip.

DETAILED DESCRIPTION OF THE PREFERRED EMBODIMENTS

FIGS. 1A–1D illustrate a micro array chip 1 according to a first embodiment of an invention which is used as a 96-well PCR chip.

Figure 1A:
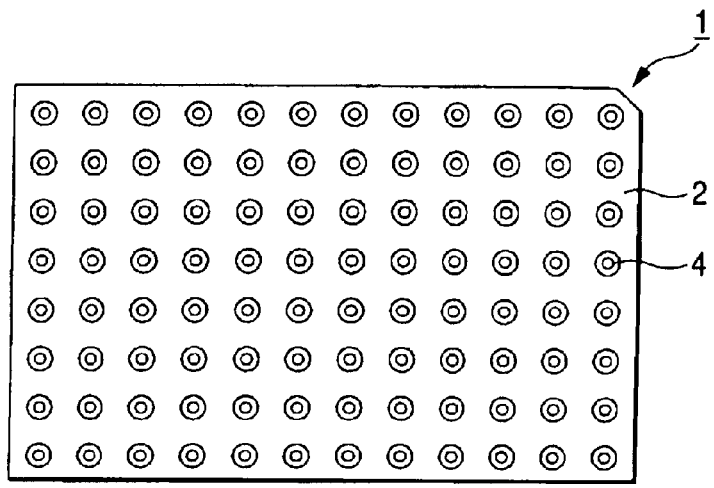
FIG. 1A is a plan view of a micro array chip 1 according to an embodiment of the invention.
Figure 1B:
FIG. 1B is a front view of the micro array chip 1.
Figure 1C:
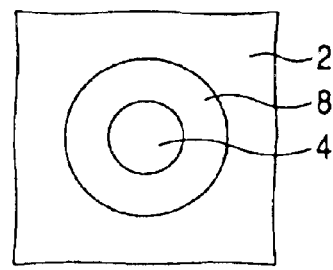
FIG. 1C is an enlarged plan view showing a single well in the micro array chip 1 and the nearby area.
Figure 1D:
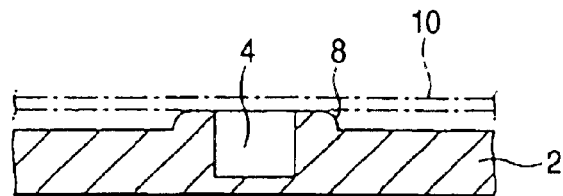
FIG. 1D is an enlarged cross section showing a single well in the micro array chip 1 and the nearby area.

FIG. 1A is a plan view; FIG. 1B is a front view; FIG. 1C is an enlarged plan view showing a single well and the nearby area; FIG. 1D is an enlarged cross section showing a single well and the nearby area.

The micro array chip 1 is a shaped article made of resin (polypropylene) by high-speed injection molding.

A chip body 2 has a thickness of 1 mm. The chip body 2 has wells 4 that are formed as cylindrical recesses that are open to a surface of the chip body. Each well has a capacity of 1.2 µL and its bottom 6 has a wall thickness of 250 µm.

An overall shape of the micro array chip 1 is a rectangle 54.5 mm long and 36.5 mm wide and it is a flat plate with a level bottom surface. The chip has an array of 96 wells.

The micro array chip 1 was immersed in BSA (bovine serum albumin) (250 µg/mL) for 30 minutes so that an inner surfaces of the wells 4 were protected against adherence of in vivo samples.

A constituent material of the chip body 2 is not limited to polypropylene. It may be made of polyethylene, polycarbonate or any other resins that have chemical resistance and which can be molded into shapes.

An opening of each well 4 is surrounded by an annular protrusion part 8 that is raised from a surface of the chip body 2 by a height of 200 µm. When a sheet of sealant 10 made of aluminum or a resin (e.g. polyester) is put over the openings of the wells 4, the raised annular protrusion portions 8 contribute to providing better seal or enhancing an airtightness of the closed space in each of the wells 4.

The sealant 10 is coated with an adhesive to ensure that the wells 4 are each sealed to provide a closed space. The sealant 10 can be readily peeled from the chip body 2 in order to inject a sample into the recesses or recover the reaction mixture after the reaction ends.

The conventional microtiter plate requires as much as 5 µL of sample even if it consists of 384 wells. In contrast, the micro array chip 1 enables PCR amplification of a sample whose volume is as small as 0.5 µL.

If it is used to perform a reaction as a preliminary treatment in a micro-assay such as chip electrophoresis, the cost of reagents and the volume of waste liquid can effectively be reduced.

Since the chip body 2 is in a form of a flat plate, it can be used with a heat block in flat plate form which is independent of chip specifications such as the number of wells and their shape.

As the bottom of each well has a smaller wall thickness, more efficient temperature control can be accomplished by the heat block.

On the other hand, greater difficulty is involved in shaping the micro array chip by injection molding. One way to form a micro array chip by injection molding and still reduce the wall thickness of the bottom of each well is by forming through-holes in the chip body and closing the openings at the bottom with a thin film.

Figure 2:
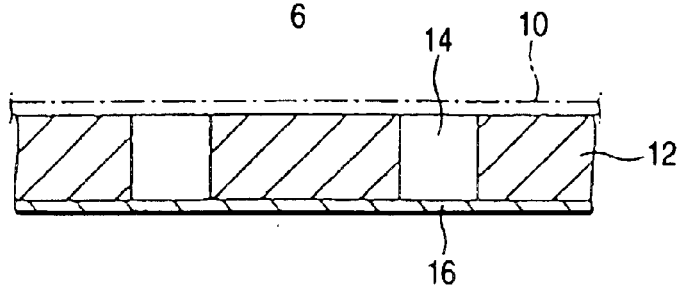
FIG. 2 is a partial cross section of a micro array chip according to another embodiment of the invention.

FIG. 2 illustrates a second example of the invention in which the recesses are formed in the way just described above. As in the first example illustrated in FIG. 1, the micro array chip in the second example is generally formed as a flat plate. The difference is that in the second example, well forming through-holes 14 are formed in the chip body 12 by injection molding and the openings at the bottom are closed with a thin film 16.

The thin film 16 is not thicker than 300 µm. It is preferably made of polyethylene or polystyrene and, more preferably made of the same material as the chip body 12. The thin film 16 can be thermally fused to a back side of the chip body 12, whereby an openings at the bottoms of the through-holes are closed to form wells 14 as tiny recesses.

As in the first example illustrated in FIG. 1, the open top of the micro array chip according to the second example may be sealed with a sealant film 10 to form a closed space in each of the wells 14.

Using the micro array chip 1 according to the first example illustrated in FIG. 1, a portion of λ phage vector (~500 bp) was amplified through 18 thermal cycles of 94° C.→55° C.→72° C. The amplified sample was electrophoresed in 8% polyacrylamide mixed with intercalator SYBR-Green (Trademark of Molecular Probes) and detected with a fluorescence DNA sequencer. The result is shown in FIG. 3.

Figure 3:
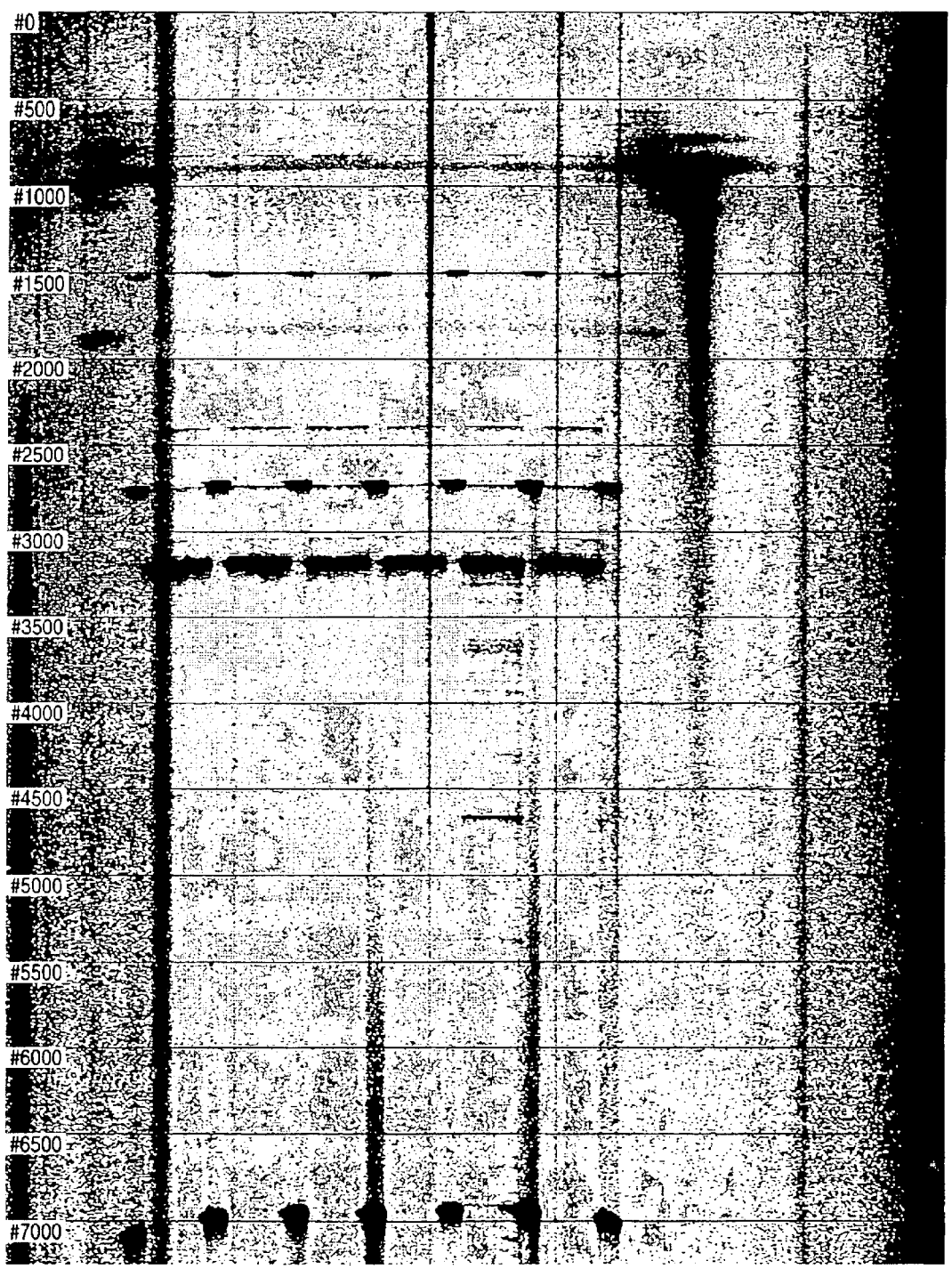
FIG. 3 is a diagram showing an electrophoresis pattern of DNA samples prepared with the micro array chip 1 illustrated in FIGS. 1A–1D.

In FIG. 3, six thick bands between #3000 and #3500 are the electrophoresis bands of the sample. The electrophoresis number following the mark # is the scan number for detection by the DNA sequencer and indicates the time from a start of electrophoresis.

Seven short bands refer to the molecular weight marker. The sample and the molecular weight marker actually have the same band width. Therefore, each of the six thick bands is a link of three bands corresponding to three samples.

A result shown in FIG. 3 was obtained by varying the quantity of samples to be processed in the wells of the micro array chip 1.

A sample quantity was 0.5 µL for two thick bands of the six thick bands on the left side between #3000 and #3500. A sample quantity was 0.7 µL for two thick bands in a center between #3000 and #3500. A sample quantity was 1.0 µL for two thick bands on the right side between #3000 and #3500. Obviously, a sharp electrophoresis pattern was obtained with samples whose quantity was as small as 0.5 µL.

The micro array chip of the invention has a plurality of recesses that are open to the surface of a chip body in flat plate form and which have a capacity of a few microliters or less and a bottom with a wall thickness of no than 300 micrometers.

The microchip of the invention can be changed for another chip of a different well number or shape without changing heat blocks. Therefore, the microchip can be handled conveniently and at lower cost.

What is claimed is:

1. A micro array chip for reaction vessels, comprising:
   a body, said body having a unitary structure and being formed from a chemically resistant, moldable material, said body having a top surface and a bottom surface, said top surface having a plurality of openings formed therein and said bottom surface having a flat shape; and
   a plurality of recesses formed in said body and extending from said top surface toward said bottom surface, each of said plurality of recesses being generally cylindrical in shape and being aligned with one of said plurality of openings;
   wherein a distance between a bottom of the recesses and the bottom surface of said body is 300 micrometers or less.

2. A micro array chip for reaction vessels, comprising:
   a chip body, said chip body having a top surface and a bottom surface, said top surface having a plurality of openings formed therein and said bottom surface having a flat shape;
   a plurality of through holes formed in said chip body and extending from said top surface to said bottom surface; and
   a thin film secured to said bottom surface of said chip body so as to close said through holes and thereby define a plurality of recesses, each of said plurality of recesses being aligned with one of said plurality of openings, and wherein said thin film has a thickness of 300 micrometers or less.

3. The micro array chip for reaction vessels according to claim 1, wherein some of said plurality of recesses receive sample material whereas others of said plurality of recesses are provided to lower a heat capacity of the micro array chip.

4. A micro array chip for reaction vessels, comprising:
   a chip body, said chip body having a top surface and a bottom surface, said top surface having a plurality of openings formed therein and said bottom surface having a flat shape; and
   a plurality of recesses formed in said chip body and extending from said top surface toward said bottom surface, each of said plurality of recesses being aligned with one of said plurality of openings,
   wherein a distance between a bottom of the recesses and the bottom surface of said chip body is 300 micrometers or less, and
   wherein inner surfaces of the recesses are coated with an agent that resists adherence of in vivo samples.

5. A micro array chip for reaction vessels, comprising:
   a chip body, said chip body having a top surface and a bottom surface, said top surface having a plurality of openings formed therein and said bottom surface having a flat shape;
   a plurality of recesses formed in said chip body and extending from said top surface toward said bottom surface, each of said plurality of recesses being aligned with one of said plurality of openings, and,
   a sealing member, said sealing member being releasably secured to said top surface so as to cover said openings and thereby form a closed space in each of the recesses,
   wherein a distance between a bottom of the recesses and the bottom surface of said chip body is 300 micrometers or less.

6. The micro array chip for reaction vessels according to claim 5, wherein the chip body further has a protrusion portion extending from said top surface and surrounding each of the openings, said protrusion portion being securely engaged by the sealing member so as to seal the recesses.

7. The micro array chip for reaction vessels according to claim 2, wherein some of said plurality of recesses serve as reaction vessels and receive sample material whereas others of said plurality of recesses are provided to lower a heat capacity of the micro array chip.

8. The micro array chip for reaction vessels according to claim 2, wherein inner surfaces of the recesses are coated with an agent that resists adherence of in vivo samples.

9. The micro array chip for reaction vessels according to claim 2, further comprising:
   a sealing member, said sealing member being releasably secured to said top surface so as to cover said openings and thereby form a closed space in each of the recesses.

10. The micro array chip for reaction vessels according to claim 9, wherein the chip body further has a protrusion portion extending from said top surface and surrounding each of the openings, said protrusion portion being securely engaged by the sealing member so as to seal the recesses.

11. The micro array chip for reaction vessels according to claim 1, wherein each of said plurality of recesses is adapted to hold a predetermined volume of sample material.

12. The micro array chip for reaction vessels according to claim 11, wherein said predetermined volume is three microliters or less.

13. The micro array chip for reaction vessels according to claim 11, wherein said predetermined volume is 1.2 microliters or less.

14. The micro array chip for reaction vessels according to claim 2, wherein each of said plurality of recesses has a predetermined capacity.

15. The micro array chip for reaction vessels according to claim 14, wherein said predetermined capacity is three microliters or less.

16. The micro array chip for reaction vessels according to claim 14, wherein said predetermined capacity is 1.2 microliters or less.

17. A micro array chip for reaction vessels, comprising:
   a chip body, said chip body having a top surface and a bottom surface, said top surface having a plurality of openings formed therein and said bottom surface having a flat shape; and
   a plurality of recesses formed in said chip body and extending from said top surface toward said bottom surface, each of said plurality of recesses being aligned with one of said plurality of openings,
   wherein a distance between a bottom of the recesses and the bottom surface of said chip body is 300 micrometers or less, and
   wherein said chip body is formed from a moldable resin material, and said plurality of recesses are generally cylindrical in shape.

18. The micro array chip for reaction vessels according to claim 2, wherein said chip body is formed from a moldable resin material, and wherein said plurality of recesses are generally cylindrical in shape.

19. The micro array chip for reaction vessels according to claim 1, further comprising through-holes or further recesses formed in areas of the chip body where no recesses are formed, said through-holes or further recesses serving to lower a heat capacity of the micro array chip.

20. The micro array chip for reaction vessels according to claim 2, further comprising through-holes or further recesses formed in areas of the chip body where no recesses are formed, said through-holes or further recesses serving to lower a heat capacity of the micro array chip.

* * * * *